(12) United States Patent
Liang et al.

(10) Patent No.: US 11,984,459 B2
(45) Date of Patent: May 14, 2024

(54) ARRAY SUBSTRATE AND OLED DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventors: Chao Liang, Hubei (CN); Liang Ma, Hubei (CN); Xuyang Liu, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 793 days.

(21) Appl. No.: 16/980,095

(22) PCT Filed: Jun. 22, 2020

(86) PCT No.: PCT/CN2020/097353
§ 371 (c)(1),
(2) Date: Sep. 11, 2020

(87) PCT Pub. No.: WO2021/248553
PCT Pub. Date: Dec. 16, 2021

(65) Prior Publication Data
US 2022/0246649 A1 Aug. 4, 2022

(30) Foreign Application Priority Data
Jun. 11, 2020 (CN) .......................... 202010530758.1

(51) Int. Cl.
*H01L 27/12* (2006.01)
*H10K 59/131* (2023.01)
(Continued)

(52) U.S. Cl.
CPC ...... *H01L 27/1259* (2013.01); *H01L 27/1218* (2013.01); *H01L 27/1248* (2013.01);
(Continued)

(58) Field of Classification Search
CPC ............. H01L 27/1259; H01L 27/1248; H01L 27/1218; H01L 29/41733; H10K 59/131;
(Continued)

(56) References Cited

U.S. PATENT DOCUMENTS

2016/0190221 A1* 6/2016 Cho .................... H10K 59/1213
257/40
2018/0342707 A1* 11/2018 Lee ......................... H10K 71/00
(Continued)

FOREIGN PATENT DOCUMENTS

| CN | 108376672 A | 8/2018 |
|---|---|---|
| CN | 108962946 A | 12/2018 |

(Continued)

*Primary Examiner* — Michael M Trinh

(57) ABSTRACT

An array substrate and an OLED display panel are provided. The array substrate includes a base substrate, a first film layer set and a second film layer set. A bending area of the array substrate has a first trench throughout the first film layer set and a second trench throughout the second film layer set. The first film layer set close to the second film layer set has a blocking part having an etching opening corresponding to the first trench. The etching opening is throughout the blocking part. A bottom of the etching opening connects to a top of the first trench. A bottom of the second trench connects to a top of the blocking part.

14 Claims, 18 Drawing Sheets

(51) Int. Cl.
*H10K 77/10* (2023.01)
*H10K 102/00* (2023.01)

(52) U.S. Cl.
CPC .......... *H10K 59/131* (2023.02); *H10K 77/111* (2023.02); *H10K 2102/311* (2023.02)

(58) Field of Classification Search
CPC ............. H10K 59/1201; H10K 77/111; H10K 2102/311; H10K 71/00
See application file for complete search history.

(56) References Cited

U.S. PATENT DOCUMENTS

| | | |
|---|---|---|
| 2019/0348490 A1 | 11/2019 | Choi et al. |
| 2020/0161570 A1 | 5/2020 | Bai et al. |
| 2020/0357829 A1 | 11/2020 | Yang et al. |
| 2021/0066440 A1* | 3/2021 | Okabe .................. H10K 59/131 |
| 2021/0272485 A1* | 9/2021 | Song .................... H10K 77/111 |
| 2023/0180539 A1* | 6/2023 | Bai ....................... H10K 59/131 |
| | | 257/40 |

FOREIGN PATENT DOCUMENTS

| | | |
|---|---|---|
| CN | 109065583 A | 12/2018 |
| CN | 110137186 A | 8/2019 |
| CN | 111106149 A | 5/2020 |

\* cited by examiner

ARRAY SUBSTRATE AND OLED DISPLAY PANEL

FIELD OF THE INVENTION

The present invention relates to a display technique, and more particularly, to an array substrate and an OLED display panel.

BACKGROUND

The OLED display panel is widely used in the display technology field because its low power consumption, high saturation, short response time, and wide view angle and will be used in all kinds of applications such as cars, mobile phones, tablets, computers and TV products. In order to reduce the width of the side frame of the display panel, the side frame is partially bended to the back of the display panel such that the effect of narrow or no side frame could be achieved. As shown in FIG. 1, in order to make it easy to bend the display panel, a trench 12 of a ladder shape is formed on the area to be bended on the film layer structure 11 of the display panel such that the stress for bending the display panel could be reduced.

However, it might require multiple masks to form the trench. This manufacture process spends more time and money.

SUMMARY

One objective of an embodiment of the present invention is to provide an OLED display panel and an array substrate to solve the above-mentioned issue of manufacturing cost and time.

According to an embodiment of the present invention, an array substrate is disclosed. The array substrate includes: a display area, a bending area at a side of the display area, a base substrate, a first film layer set positioned on the base substrate, and a second film layer set positioned at one side of the first film layer set, which is comparatively far away from the base substrate. The bending area has a first trench throughout the first film layer set and a second trench throughout the second film layer set; one side of the first film layer set close to the second film layer set has a blocking part. The blocking part has an etching opening corresponding to the first trench. The etching opening is throughout the blocking part; a bottom of the etching opening connects to a top of the first trench. A bottom of the second trench connects to a top of the blocking part. An orthographic projection of the second trench on the base substrate covers an orthographic projection of the etching opening on the base substrate.

In some embodiments, the array substrate further comprises: a buffer layer, positioned on the base substrate, an active layer, positioned on the buffer layer, a first gate insulating layer covering the active layer, a first gate electrode positioned on the first gate insulating layer, a second gate insulating layer covering the first gate electrode, a second gate electrode, positioned on the second gate insulating layer, an interlayer dielectric layer covering the second gate electrode, a source/drain electrode positioned on the interlayer dielectric layer, and a planarization layer, covering the source/drain electrode. The first film layer set comprises the buffer layer.

In some embodiments, the blocking part comprises a plurality of blocking block, positioned at a same layer as at least one of the active layer, the first gate electrode, and the second gate electrode. The etching opening is throughout all the blocking blocks, and the blocking blocks extend along a first direction parallel to a length direction of the first trench.

In some embodiments, the blocking blocks and the active layer are manufactured in a same process if the blocking blocks and the active layer are in a same layer. The blocking blocks and the first gate electrode are manufactured in a same process if the blocking blocks and the first gate electrode are in a same layer. The blocking blocks and the second gate electrode are manufactured in a same process if the blocking blocks and the second gate electrode are in a same layer.

In some embodiments, one end of the blocking blocks comparatively far away from the etching opening has a plurality of notches along a second direction, and the notches are distributed along the first direction.

In some embodiments, the blocking blocks comprises a plurality of blocking stripes distributed and equally-spaced along the first direction In some embodiments, the blocking part comprises a first blocking block and a second blocking block, the first blocking block is positioned in a same layer as at least one of the active layer, the first gate electrode, and the second gate electrode, and the second blocking block is positioned in a same layer as at least another one of the active layer, the first gate electrode, and the second gate electrode. The first blocking block comprises a plurality of first blocking stripes distributed and equally-spaced along the first direction, two adjacent first blocking stripes has a first gap in between. The second blocking block comprises a plurality of second blocking stripes distributed and equally-spaced along the first direction, two adjacent second blocking stripes has a second gap in between. An orthogonal projection of a first blocking strip on the base substrate cover an orthogonal projection of the second gap on the base substrate. An orthogonal projection of a second blocking strip on the base substrate covers an orthogonal projection of the first gap on the base substrate.

In some embodiments, the first trench and the second trench are manufactured by a same process.

In some embodiments, the interlayer dielectric layer has a via throughout the interlayer dielectric layer and extending to the active layer. The source/drain electrode is filling up in the via and electrically connected to the active layer. The via, the first trench and the second trench are manufactured through a same process.

According to an embodiment of the present invention, an organic light emitting diode (OLED) display panel is disclosed. The OLED display panel comprises: an array substrate, having a display area and a bending area at an side of the display area; an anode metal layer and a pixel definition layer, positioned on the array substrate; a light emitting material layer, positioned on the anode metal layer; a supporting pillar, positioned on the pixel definition layer; and a cathode layer, positioned on the pixel definition layer, the supporting pillar, and the cathode layer on the light emitting material layer. The array substrate comprises: a base substrate; a first film layer set, positioned on the base substrate; and a second film layer set, positioned at one side of the base substrate opposite to the first film layer set. The bending area has a first trench throughout the first film layer set and a second trench throughout the second film layer set; one side of the first film layer set close to the second film layer set has a blocking part; the blocking part has an etching opening corresponding to the first trench; the etching opening is throughout the blocking part; a bottom of the etching opening connects to a top of the first trench; a bottom of the second trench connects to a top of the blocking part; and an orthographic projection of the second trench on the base substrate covers an orthographic projection of the etching opening on the base substrate.

In some embodiments, the array substrate further comprises: a buffer layer, positioned on the base substrate, an active layer, positioned on the buffer layer, a first gate insulating layer covering the active layer, a first gate electrode positioned on the first gate insulating layer, a second gate insulating layer covering the first gate electrode, a second gate electrode, positioned on the second gate insulating layer, an interlayer dielectric layer covering the second gate electrode, a source/drain electrode positioned on the interlayer dielectric layer, and a planarization layer, covering the source/drain electrode. The first film layer set comprises the buffer layer.

In some embodiments, the blocking part comprises a plurality of blocking block, positioned at a same layer as at least one of the active layer, the first gate electrode, and the second gate electrode. The etching opening is throughout all the blocking blocks, and the blocking blocks extend along a first direction parallel to a length direction of the first trench.

In some embodiments, the blocking blocks and the active layer are manufactured in a same process if the blocking blocks and the active layer are in a same layer. The blocking blocks and the first gate electrode are manufactured in a same process if the blocking blocks and the first gate electrode are in a same layer. The blocking blocks and the second gate electrode are manufactured in a same process if the blocking blocks and the second gate electrode are in a same layer.

In some embodiments, one end of the blocking blocks comparatively far away from the etching opening has a plurality of notches along a second direction, and the notches are distributed along the first direction.

In some embodiments, the blocking blocks comprises a plurality of blocking stripes distributed and equally-spaced along the first direction In some embodiments, the blocking part comprises a first blocking block and a second blocking block, the first blocking block is positioned in a same layer as at least one of the active layer, the first gate electrode, and the second gate electrode, and the second blocking block is positioned in a same layer as at least another one of the active layer, the first gate electrode, and the second gate electrode. The first blocking block comprises a plurality of first blocking stripes distributed and equally-spaced along the first direction, two adjacent first blocking stripes has a first gap in between. The second blocking block comprises a plurality of second blocking stripes distributed and equally-spaced along the first direction, two adjacent second blocking stripes has a second gap in between. An orthogonal projection of a first blocking strip on the base substrate cover an orthogonal projection of the second gap on the base substrate. An orthogonal projection of a second blocking strip on the base substrate covers an orthogonal projection of the first gap on the base substrate.

In some embodiments, the first trench and the second trench are manufactured by a same process.

In some embodiments, the interlayer dielectric layer has a via throughout the interlayer dielectric layer and extending to the active layer. The source/drain electrode is filling up in the via and electrically connected to the active layer. The via, the first trench and the second trench are manufactured through a same process.

In some embodiments, the first trench extends along its length direction to pass through a front side and a back side of the first film layer set. The second trench extends along its length direction to pass through a front side and a back side of the second film layer set.

In some embodiments, the first trench and the second trench are connected to each other, and an orthogonal projection of a second trench on the base substrate covers an orthogonal projection of the first trench on the base substrate.

According to an embodiment of the present invention, a blocking part is positioned on the first film layer set. In the manufacturing process of the array substrate, after the second trench is formed by an etching step, the blocking part could be used as a mask to perform an etching step on the first film layer set. Furthermore, because the blocking effect of the blocking part, the etchant could flow to the first film layer set only through the etching opening such that the first trench, the second trench, and the via connecting the source/drain to the active layer could be formed by etching the first film layer set by one process. In this way, the number of masks and the processes could be reduced without affecting the performance of the array substrate such that the manufacturing process is simplified and the cost is reduced.

BRIEF DESCRIPTION OF THE DRAWINGS

These and other features, aspects and advantages of the present disclosure will become understood with reference to the following description, appended claims and accompanying figures.

LABELED ELEMENTS 11 film layer structure; 12 trench; 20 array substrate; 21 display area; 22 bending area; 23 base substrate; 24 first film layer set; 241 first trench; 25 second film layer set; 251 second trench; 26 blocking part; 261 etching opening; 262 blocking block; 262a notch; 262b blocking strip; 263a first blocking strip; 263b first gap; 264a second blocking strip; 264b second gap; 271 buffer layer; 272 active layer; 273 first gate insulating layer; 274 first gate electrode; 275 second gate insulating layer; 276 second gate electrode; 277 interlayer dielectric layer; 278 source/drain electrode; 279 planarization layer; 28 protection layer; 291 via; 292 wiring trench; 293 transfer terminal; 30 anode metal layer; 40 pixel definition layer; 50 light emitting material layer; 60 supporting pillar; 70 cathode layer

DETAILED DESCRIPTION OF PREFERRED EMBODIMENTS

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

As previously mentioned, when the trench is formed, multiple masks might be required such that the manufacturing time and cost are higher. According to an embodiment of the present invention, an OLED display panel is provided to address the above-mentioned issues.

Figure 1:
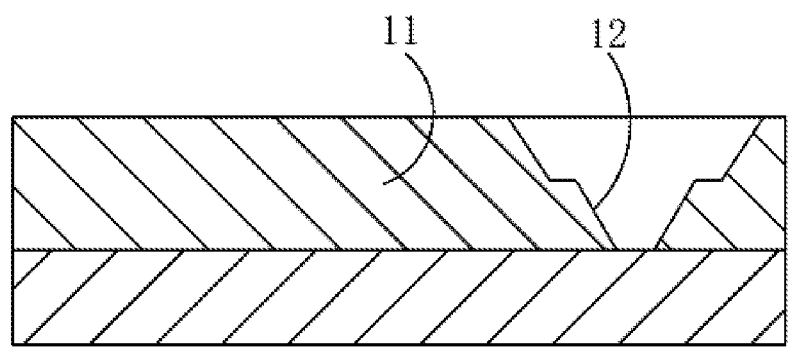
FIG. 1 is a diagram of a conventional display panel.
Figure 2:
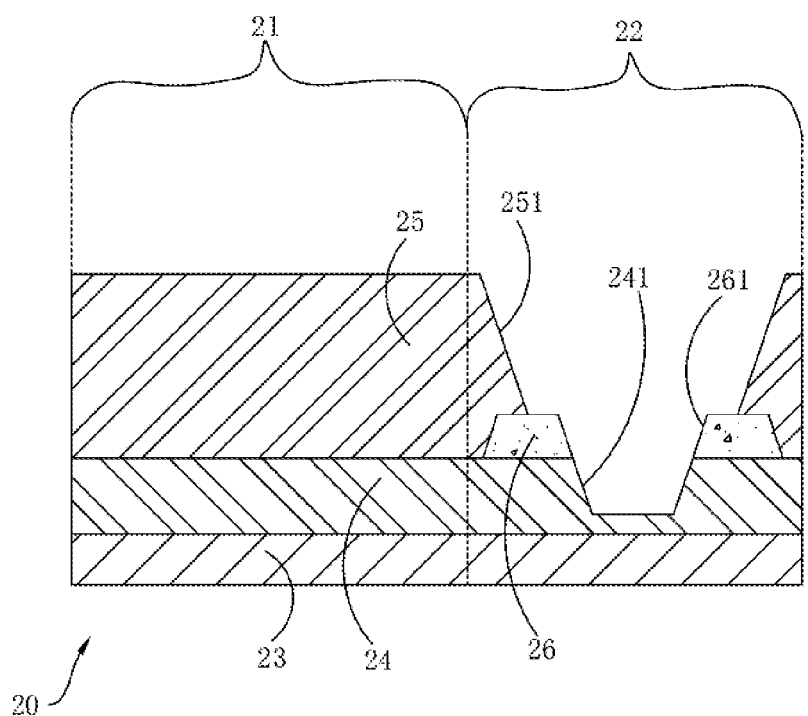
FIG. 2 is a diagram of an array substrate according to a first embodiment of the present invention.

As shown in FIG. 2, the array substrate 20 comprises a display area 21 and a bending area 22. The bending area 22 is located at the side of the display area 21. The display area 21 could be used to display an image. The bending area 22 represents the area that will be bended to the back of the array substrate 20. Connecting wires and bonding terminals could be positioned in the bending area 22. The connecting wires could be used to connect the wires (such as scan lines and data lines) in the display area 21 and an external driving chip such that the signals from the external driving chip could be transferred to the wires in the display area 21. The bonding terminals could be used to connect the driving chip to the array substrate 20 and bond the driving chip on the array substrate 20.

The array substrate 20 comprises a base substrate 23, a first film layer set 24 and a second film layer set 25. The first film layer set 24 is positioned on the base substrate 23. The second film layer set 25 is positioned at one side of the first film layer set 24, which is comparatively far away from the base substrate 23.

The base substrate 23 is a flexible substrate, which could be implemented with a material having a high temperature resistance, wide usage range, high insulating property, stable dielectric constant, such as Polyimide. The first film layer set 24 and the second film layer 25 could be a single-layer film layer structure or a multi-layer film layer structure.

The bending area 22 comprises a first trench 241 throughout the first film layer set 24 and a second trench 251 throughout the second film layer set 25. The first trench 241 extends along its length direction to pass through the front side and the back side of the first film layer set 24. The second trench 251 extends along its length direction to pass through the front side and the back side of the second film layer set 25. In this way, the first trench 241 and the second trench 251 could be used to buffer and release the bending stress to reduce the bending stress at the bending point when the bending area 22 is being bended. This could raise the bending resistance of the array substrate 20.

The first trench 241 and the second trench 251 are connected. The orthogonal projection of the second trench 251 on the array substrate 23 covers the orthogonal projection of the first trench 241 on the array substrate 23.

One side of the first film layer set 24 close to the second film layer set 25 has a blocking part 26. The blocking part 26 has an etching opening 261 corresponding to the first trench 241. The etching opening 261 is throughout the blocking part 26. The etching opening 261 is connected to the first trench 241 and the second trench 242.

The bottom of the etching opening 261 is connected to the top of the first trench 241. That is, the orthogonal projection of the bottom of the etching opening 261 on the base substrate 23 coincides with the orthogonal projection of the top of the first trench 241 on the base substrate 23. The bottom of the second trench 251 extends to the top of the blocking part 26. The orthogonal projection of the bottom of the second trench 251 on the base substrate 23 covers the orthogonal projection of the etching opening 261 on the base substrate 23.

The blocking part 26 is formed on the first film layer set 24. When other film layer structures of the array substrate 20 are being formed, the blocking part 26 could be simultaneously formed through techniques, such as half mask technique. In the manufacturing process of the array substrate 20, the blocking part 26 could be used as a mask to perform an etching process step on the first film layer set 24 after the second trench 251 is formed by performing an etching process on a predetermined location of the second film layer set 25. In this way, additional masks or photoresists are not required to form the first trench 241 throughout the first film layer set 24. Furthermore, because of the blocking effect of the blocking part 26, the etchant could flow to the first film layer structure 24 only through the etching opening 261. In this way, the first film layer set 24 could be etched to form the first trench 241 of a predetermined shape and the first trench 241 and the second trench 251 could form a ladder structure. This could reduce the number of masks and manufacturing processes without reducing the performance of the array substrate 20. Thus, the manufacturing process is simplified and the manufacturing cost is reduced.

The first trench 241 and the second trench 251 are manufactured in the same manufacturing process step.

After the second trench 251 is formed by performing an etching step on a predetermined location of the second film layer set 25, the etchant could still flow to the first film layer set 24 through the etching opening 261 such that the first trench 241 throughout the first film layer set 24 and the second trench 251 throughout the second film layer set 25 could be formed by a single etching step. This could further reduce the number of masks and simplify the entire manufacturing process steps.

The cross section of the first trench 241 and the cross section of the second trench 251 could be both trapezoid. The angle between the side surface of the first trench 241 and the horizontal surface is less than 70 degrees. The angle between the side surface of the second trench 251 and the horizontal surface is less than 70 degrees. The depth of the first trench 241 could be 0.7-1.3 microns. The depth of the second trench 251 could be 0.1-0.8 microns.

In FIG. 2, only the condition that the second film layer set 25 is positioned on the first film layer set 24 is shown. However, another film layer could be positioned between the second film layer set 25 and the first film layer set 24.

Figure 3:
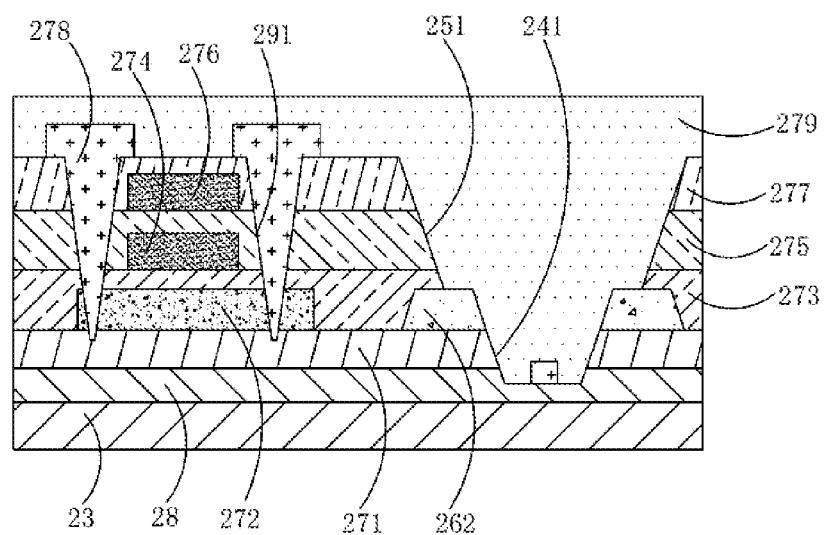
FIG. 3 is a diagram of an array substrate according to a second embodiment of the present invention.

As shown in FIG. 3, the array substrate 20 comprises a buffer layer 271, positioned on the base substrate; an active layer 272, positioned on the buffer layer 271; a first gate insulating layer 273, covering the active layer 272; a first gate electrode 274, positioned on the first gate insulating layer 273; a second gate insulating layer 275, covering the first gate electrode 274; a second gate electrode 276, positioned on the second gate insulating layer 275; an interlayer dielectric layer 277, covering the second gate electrode 276; a source/drain electrode 278, positioned on the interlayer dielectric layer 277; and a planarization layer 279, covering the source/drain electrode 278.

Here, the first film layer set 24 comprises the buffer layer 271. The first trench 241 is throughout the buffer layer 271.

The array substrate 20 further comprises a protection layer 28 positioned on the base substrate 23. The buffer 271 is positioned on the protection layer 28. The first trench 241 extends into the protection layer 28 and the depth of the first trench 241 within the protection layer 28 is less than the thickness of the protection layer 28. The protection layer 28 is used to protect the base substrate 24 to prevent the etchant from damaging the base substrate when the first trench 241 is being etched.

The interlayer dielectric layer 277 has a via throughout the interlayer dielectric layer 277 and the via 277 extends to the active layer 272. The source/drain electrode 278 is filling up in the via 291 and is electrically connected to the active layer 272. The via 291, the first trench 241, and the second trench 251 are manufactured through the same process step to reduce the number of masks and process steps and the manufacturing cost.

In an embodiment, the via 291 is throughout the active layer 272 and extends into the buffer layer 271 to increase the contact area of the source/drain electrode 278 and the active layer 272.

The planarization layer 279 is filling up in the first trench 241 and the second trench 251. The planarization layer 279 is implemented with an organic material such that the bending area 22 could have a better bending resistance. In this way, the bending area 22 may not generate cracks when its thickness is small.

The blocking part 26 comprises blocking blocks 262, which are in the same layer of at least one of the first gate electrode 274 and the second gate electrode 276. The etching opening 271 is throughout all the blocking blocks 262. The blocking blocks 262 extend along the first direction. The length directions of the first trench 241 and the second trench 251 are parallel to the first direction.

Because the blocking blocks 262 are in the same layer of at least one of the first gate electrode 274 and the second gate electrode 276, the blocking blocks 262 do not increase the thickness of the array substrate 20 when the blocking blocks 262 are used to form the first trench 241 of a predetermined shape.

The blocking blocks 262 and the active layer 272 are manufactured in the same process step if the blocking blocks 262 and the active layer 272 are in the same layer. The blocking blocks 262 and the first gate electrode 274 are manufactured in the same process step if the blocking blocks 262 and the first gate electrode 274 are in the same layer. The blocking blocks 262 and the second gate electrode 276 are manufactured in the same process step if the blocking blocks 262 and the second gate electrode 276 are in the same layer.

When the active layer 272 is being patterned, the blocking blocks 262 in the same layer as the active layer 272 could be formed. When the first gate electrode 274 is being patterned, the blocking blocks 262 in the same layer as the first gate electrode 274 could be formed. When the second gate electrode 276 is being patterned, the blocking blocks 262 in the same layer as the second gate electrode 276 could be formed. In this way, the number of masks and process steps could be reduced and thus the manufacturing cost could also be reduced.

In the first embodiment, the blocking part 26 is a single-layer structure. That is, the blocking part 26 comprises only one layer of blocking blocks 262. In this case, the blocking blocks 262 could be in the same layer as the active layer 272, the first gate electrode 274 and the second gate electrode 276.

As shown in FIG. 3, if the blocking part 26 and the active layer 272 are in the same layer, the second film layer set 25 comprises the first gate insulating layer 273, the second gate insulating layer 275 and the interlayer dielectric layer 277. The blocking blocks 262 are partially covered by the first gate insulating layer 273.

In the second embodiment, the blocking part 26 is a double-layer structure. That is, the blocking part 26 comprises blocking blocks 262 of two different layers. In this case, blocking blocks 262 of one layer could be in the same layer as at least one of the active layer 272, the first gate electrode 274 and the second gate electrode 276. The blocking blocks 262 of another layer could be in the same layer as at least another one of the active layer 272, the first gate electrode 274 and the second gate electrode 276.

Figure 4:
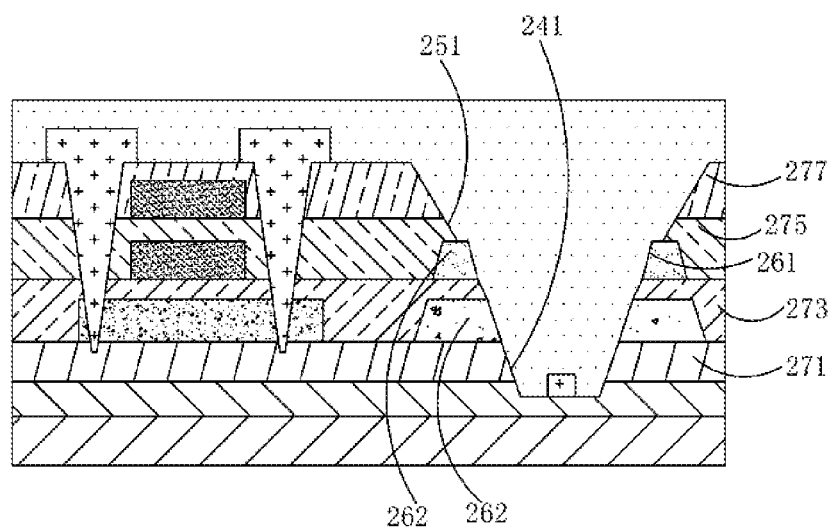
FIG. 4 is a diagram of an array substrate according to a third embodiment of the present invention.

As shown in FIG. 4, the blocking blocks 262 of one layer and the active layer 272 are in the same layer. The blocking blocks 262 of another layer and the first gate electrode 274 are in the same layer. In this case, the second film layer set 25 comprises the second gate insulating layer 275 and the interlayer dielectric layer 277. The blocking blocks 262 close to the base substrate 23 are partially covered by the first gate insulating layer 273. The blocking blocks 262 away from the base substrate 23 are partially covered by the second gate insulating layer 275. The etching opening 261 is throughout the blocking blocks 262 of two layers.

In the third embodiment, the blocking part 26 is a triple-layer structure. That is, the blocking part 26 comprises blocking blocks 262 of three different layers. In this case, the blocking blocks 262 of the first layer could be in the same layer as the active layer 272. The blocking blocks 262 of the second layer could be in the same layer as the first gate electrode 274. The blocking blocks 262 of the second layer could be in the same layer as the second gate electrode 276. In this case, the second film layer set 25 comprises the interlayer dielectric layer 277. The blocking blocks 262 having the longest distance away from the base substrate 23 are partially covered by the second gate insulating layer 275.

Figure 5:
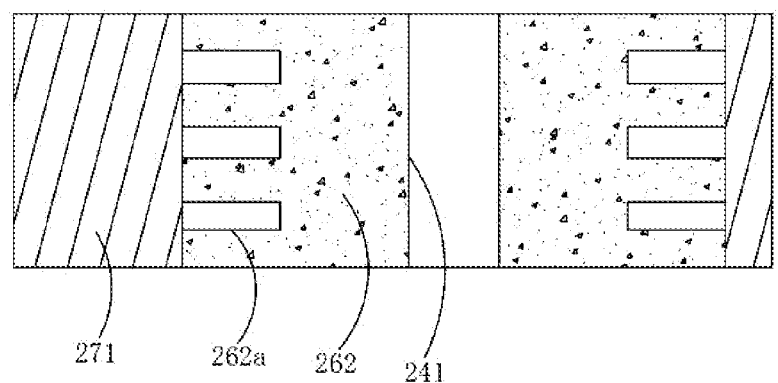
FIG. 5 is a diagram of a blocking block according to a first embodiment of the present invention.
Figure 6:
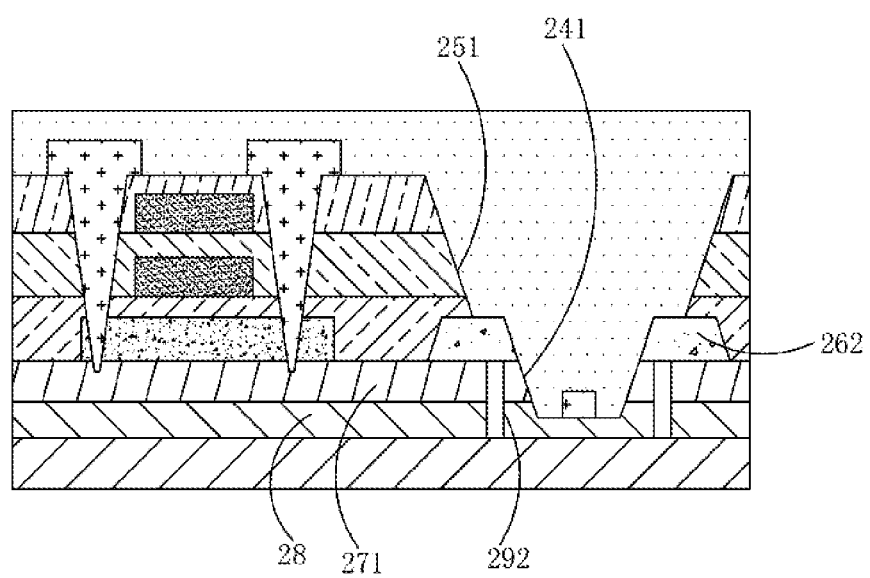
FIG. 6 is a diagram of an array substrate according to a fourth embodiment of the present invention.

As shown in FIG. 5 and FIG. 6, the end of the blocking block 262 away from the etching opening 261 has a plurality of notches 262a extending along the second direction. The notches 262a are distributed and equally-spaced along the first direction. The first direction is vertical to the second direction.

Please refer to FIG. 6. When the blocking blocks 262 are used to simultaneously form the first trench 241 and the second trench 251 in one process step, the etchant flows into the first film layer set 24 through the notches 262a such that the buffer layer 271 underneath the notches 262a is etched to form a wiring trench 292. In this way, it can prevent large amount of etchant being left in the array substrate 20. Furthermore, it could lead the wires, such as scan lines, in the display area 21 from the notches 262a and the wiring trenches 292 such that the wires in the display area 21 could be connected to the connecting wires in the bending area 22. In addition, one notch 262a could be arranged to be corresponding to a wire to prevent from the wires being short to each other.

In the case of the blocking blocks 262 of multiple layers, the orthogonal projections of notches 262a of the blocking blocks 262 on the base substrate 23 could be coincided, overlapped, or isolated.

Figure 7:
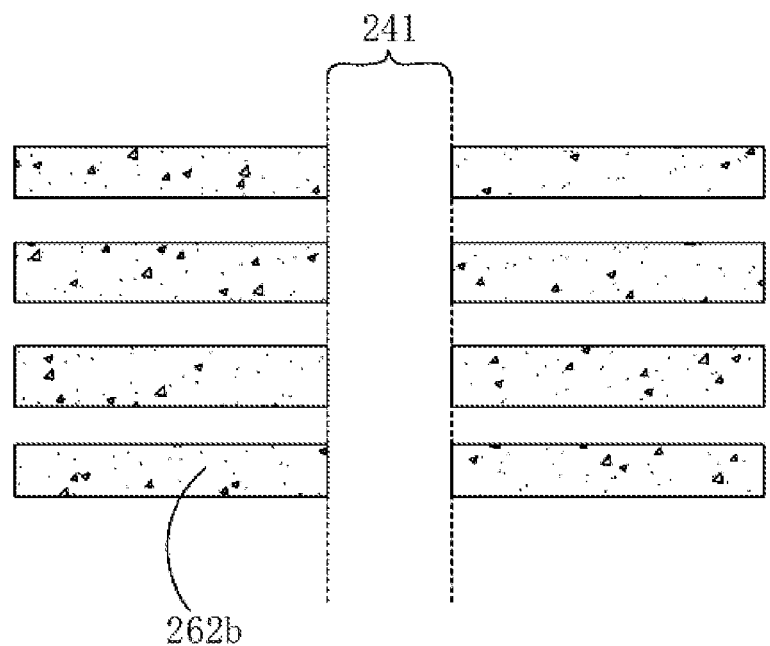
FIG. 7 is a diagram of a blocking block according to a second embodiment of the present invention.

As shown in FIG. 7, in another embodiment, the blocking blocks 262 comprises a plurality of blocking stripes 262b distributed and equally-spaced along the first direction. There is a gap between two adjacent blocking stripes 262b.

In the case of blocking blocks 262 of multiple layers, the orthogonal projections of gaps of the blocking blocks 262 on the base substrate 23 could be coincided, overlapped, or isolated.

Figure 8:
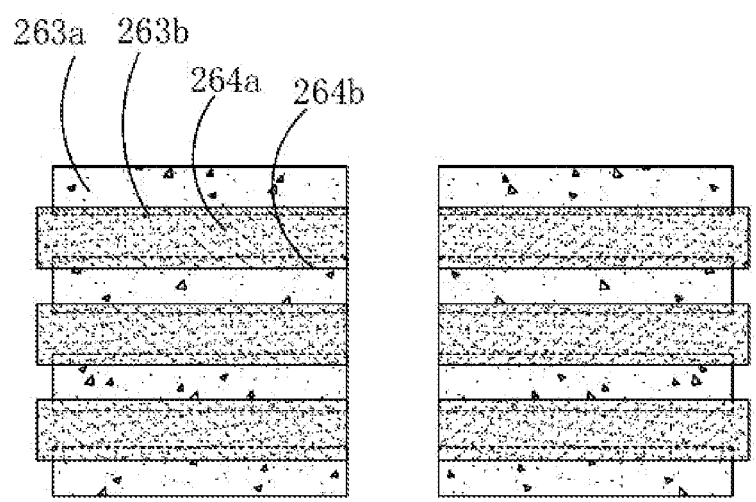
FIG. 8 is a diagram of a blocking block according to a third embodiment of the present invention.

As shown in FIG. 8, In the case that the blocking blocks 262 has two or three layers of blocking blocks 262, the blocking part 26 comprises a first blocking block and a second blocking block. The first blocking block and one of the active layer 272, the first gate electrode 274 and the second gate electrode 276 are in the same layer. The second blocking layer and another one of the active layer 272, the first gate electrode 274 and the second gate electrode 276 are in the same layer.

The first blocking block 262 comprises a plurality of first blocking stripes 263a distributed and equally-spaced along the first direction. There is a gap 263b between two adjacent first blocking stripes 263a. The second blocking block 262 comprises a plurality of second blocking stripes 264a distributed and equally-spaced along the first direction. There is a gap 264b between two adjacent second blocking stripes 264a. The orthogonal projection of the first block stripes 263a on the base substrate 23 covers the orthogonal projection of the second gaps 264b on the base substrate 23. The orthogonal projection of the second block stripes 264a on the base substrate 23 covers the orthogonal projection of the first gaps 263b on the base substrate 23. In this way, multiple isolated wiring trenches 292 could be formed on different film layers such that the wires could be led from the display area 21. In addition, it can prevent the etchant from etching the same position of the first film layer set 24, which may damage the base substrate 23.

Please refer to FIGS. 9-13. FIGS. 9-13 depict a flow of manufacturing an array substrate when the blocking part comprises blocking blocks of a single layer according to an embodiment of the present invention.

Figure 9:
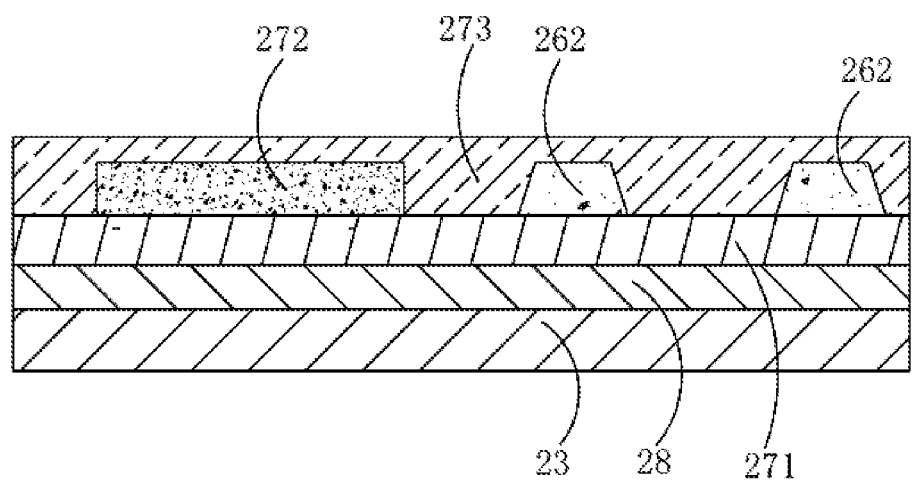
FIGS. 9-13 depict a flow of manufacturing an array substrate when the blocking part comprises blocking blocks of a single layer according to an embodiment of the present invention.

As shown in FIG. 9, the blocking blocks 262 and the active layer 272 are in the same layer. Inorganic materials are orderly stacked on the base substrate 23 to form the protection layer 28 and the buffer layer 271. Then, an amorphous silicon material is formed on the buffer layer 271 to form an amorphous layer covering the buffer layer 271. The laser process is applied on the amorphous layer to form a poly-silicon layer. The amorphous layer is patterned to form the isolated active layer 272 and the blocking blocks 262. The first gate insulating layer 273 is formed to cover the active layer 272, the blocking blocks 262 and the buffer layer 271.

Figure 10:
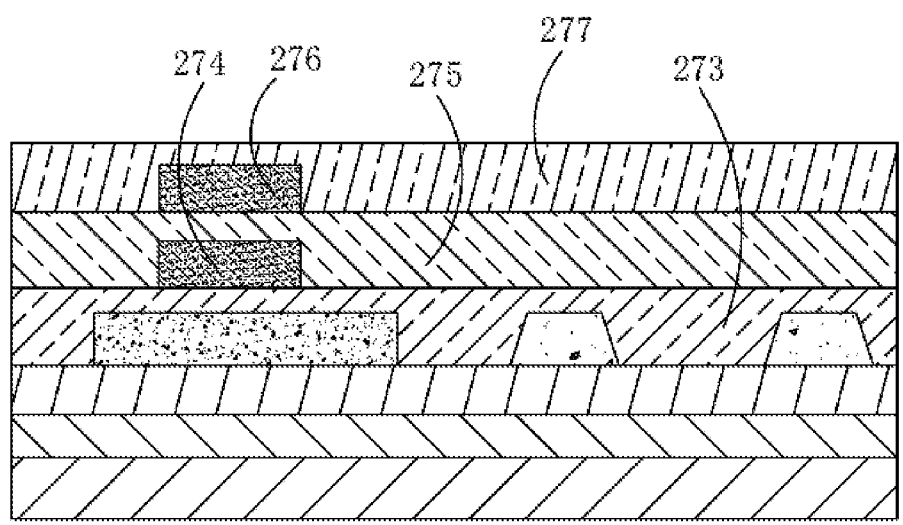

As shown in FIG. 10, the first metal layer is formed on the first gate insulating layer 273 and then patterned to form the first gate electrode 274. Then, an ion doping process is applied on the first gate electrode 271. The second insulating layer 275 covering the first gate electrode 274 and the first gate insulating layer 273 is formed. The second metal layer is formed on the second gate insulating layer 275 and patterned to form the second gate electrode 276. The interlayer dielectric layer 277 covering the second gate electrode 276 and the second gate insulating layer 275 is formed.

Figure 11:
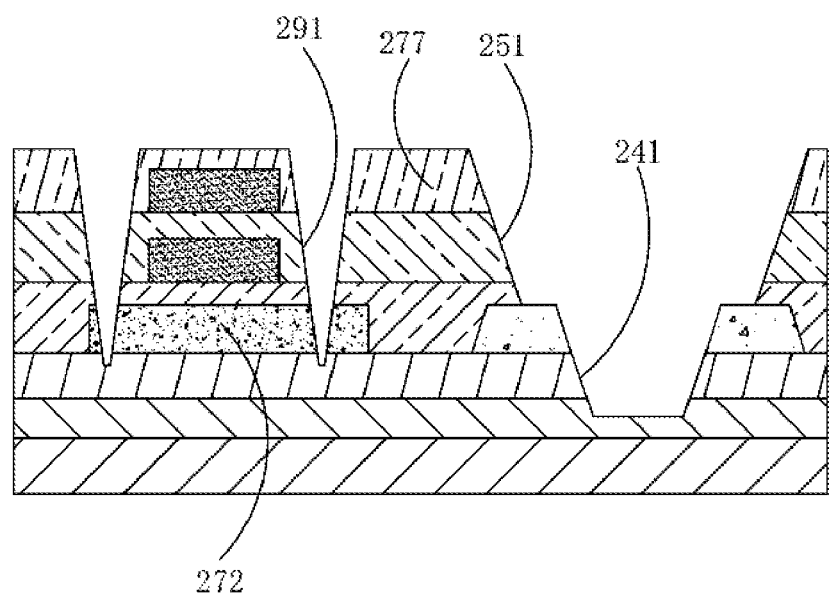

As shown in FIG. 11, the etchant is used to etch the interlayer dielectric layer 277 to form a via 291 throughout the active layer 272 and extending to the buffer layer 271. Furthermore, the interlayer dielectric layer 277 is also etched to form the first trench 241, which is throughout the buffer layer 271 and located in the bending area 22, and a second trench 251, which is throughout the first gate insulating layer 273, the second gate insulating layer 275 and the interlayer dielectric layer 277. The via 291, the first trench 241 and the second trench 251 are manufactured by the same etching step.

Figure 12:
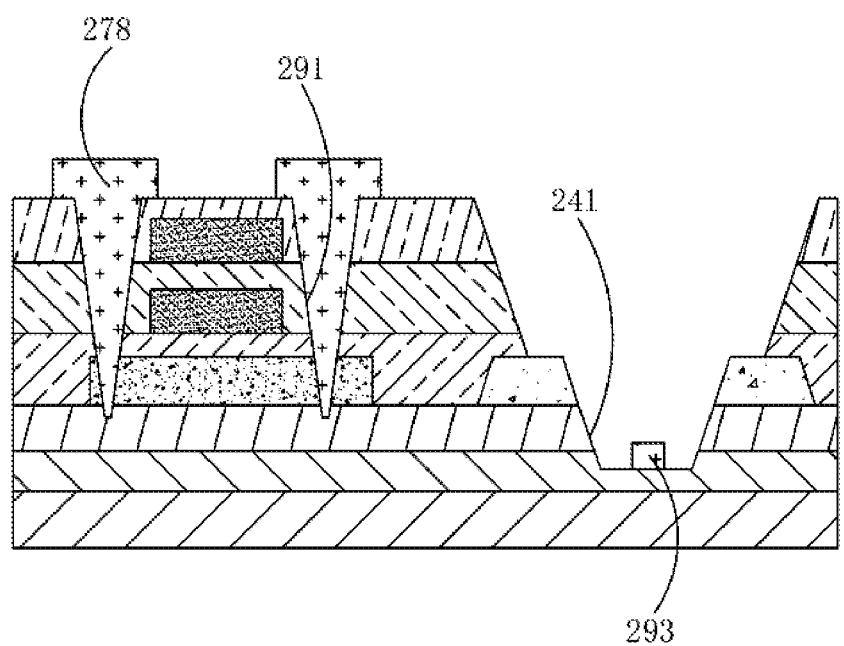

As shown in FIG. 12, the third metal layer is formed on the interlayer dielectric layer 277 and patterned to form the source/drain electrode 278, which is filling up in the via 291.

When the third metal layer is patterned to form the source/drain electrode 278, the transfer terminal 293 in the first trench 241 could be simultaneously formed. The transfer terminal 293 could be used to connect the driving chip to the wire in the display area 21 to establish the connection between the driving chip and the wire in the display area 21.

Figure 13:
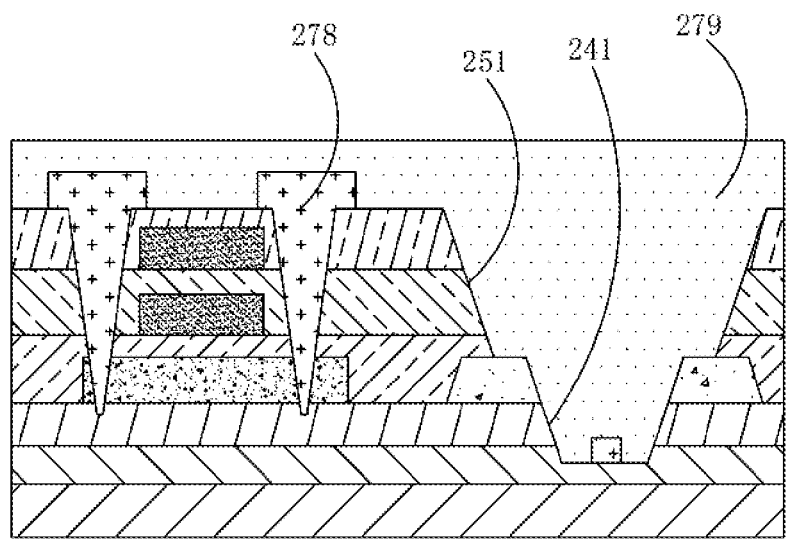

As shown in FIG. 13, the planarization layer 279, covering the source/drain electrode 278 and filling up in the first trench 241 and the second trench, is formed.

When the blocking blocks 262 and the first gate electrode 274 are in the same layer, the first metal layer could be patterned to form the first gate electrode 274 as well as the blocking blocks 262. When the blocking blocks 262 and the second gate electrode 276 are in the same layer, the second metal layer could be patterned to form the second gate electrode 276 as well as the blocking blocks 262.

As shown in FIGS. 14-17, FIGS. 14-17 depict a flow of manufacturing an array substrate 20 when the blocking part 26 comprises blocking blocks 262 of two layers according to an embodiment of the present invention.

Figure 14:
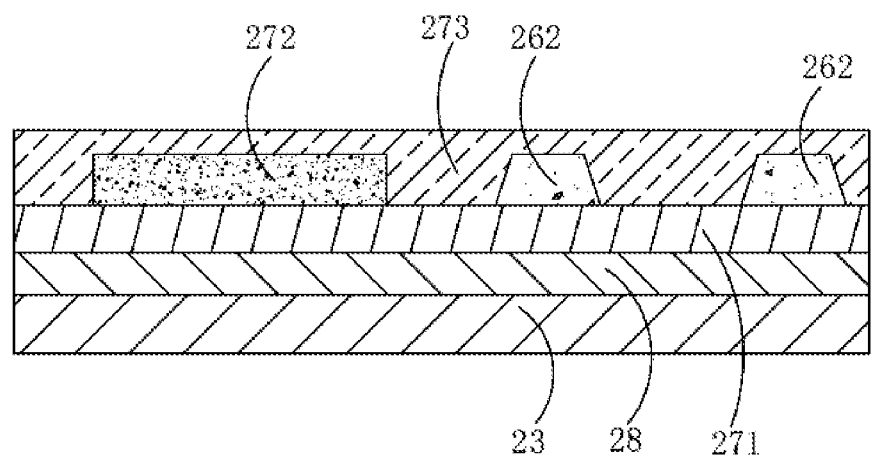
FIGS. 14-17 depict a flow of manufacturing an array substrate when the blocking part comprises blocking blocks of two layers according to an embodiment of the present invention.

As shown in FIG. 14, the blocking blocks 262 of one layer and the active layer 272 are in the same layer and the blocking blocks 262 of another layer and the first gate electrode 274 are in the same layer. Inorganic materials are orderly stacked on the base substrate 23 to form the protection layer 28 and the buffer layer 271. Then, an amorphous silicon material is formed on the buffer layer 271 to form an amorphous layer covering the buffer layer 271. The laser process is applied on the amorphous layer to form a poly-silicon layer. The amorphous layer is patterned to form the isolated active layer 272 and the blocking blocks 262 of the first layer. The first gate insulating layer 273 is formed to cover the active layer 272, the blocking blocks 262 and the buffer layer 271.

Figure 15:
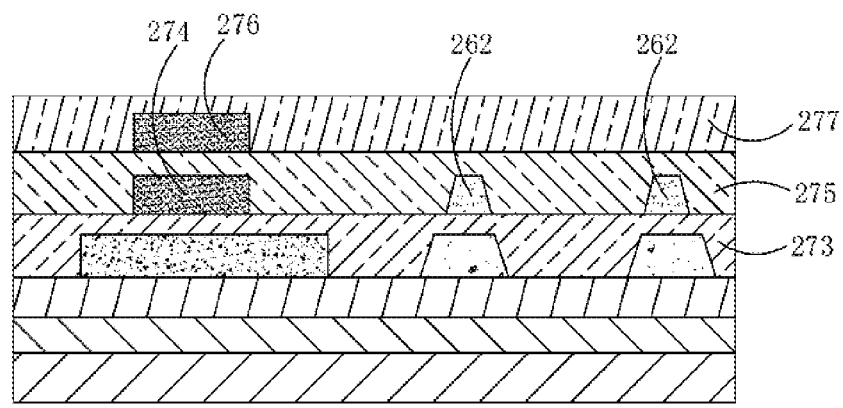

As shown in FIG. 15, the first metal layer is formed on the first gate insulating layer 273 and then patterned to form the first gate electrode 274 and the blocking blocks 262 of the second layer. Then, an ion doping process is applied on the first gate electrode 271. The second insulating layer 275 covering the first gate electrode 274 and the first gate insulating layer 273 is formed. The second metal layer is formed on the second gate insulating layer 275 and patterned to form the second gate electrode 276. The interlayer dielectric layer 277 covering the second gate electrode 276 and the second gate insulating layer 275 is formed.

Figure 16:
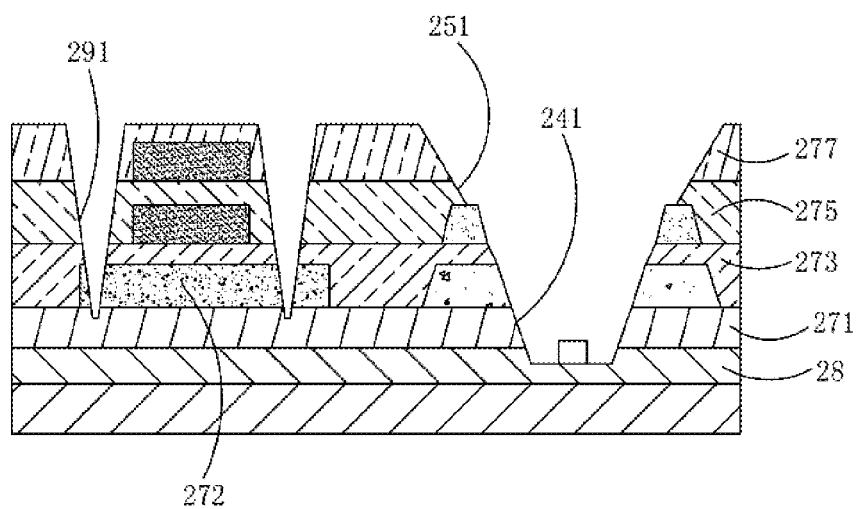

As shown in FIG. 16, the etchant is used to etch the interlayer dielectric layer 277 to form a via 291 throughout the active layer 272 and extending to the buffer layer 271. Furthermore, the interlayer dielectric layer 277 is also etched to form the first trench 241, which is throughout the buffer layer 271 and located in the bending area 22, and a second trench 251, which is throughout the first gate insulating layer 273, the second gate insulating layer 275 and the interlayer dielectric layer 277. The via 291, the first trench 241 and the second trench 251 are manufactured by the same etching step.

Figure 17:
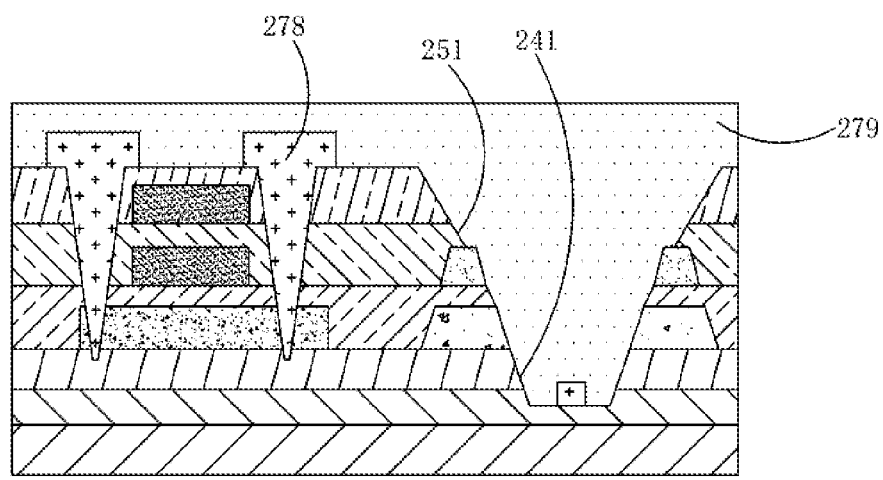

As shown in FIG. 17, the third metal layer is formed on the interlayer dielectric layer 277 and patterned to form the source/drain electrode 278, which is filling up in the via 291.

The planarization layer 279, covering the source/drain electrode 278 and filling up in the first trench 241 and the second trench, is formed.

Figure 18:
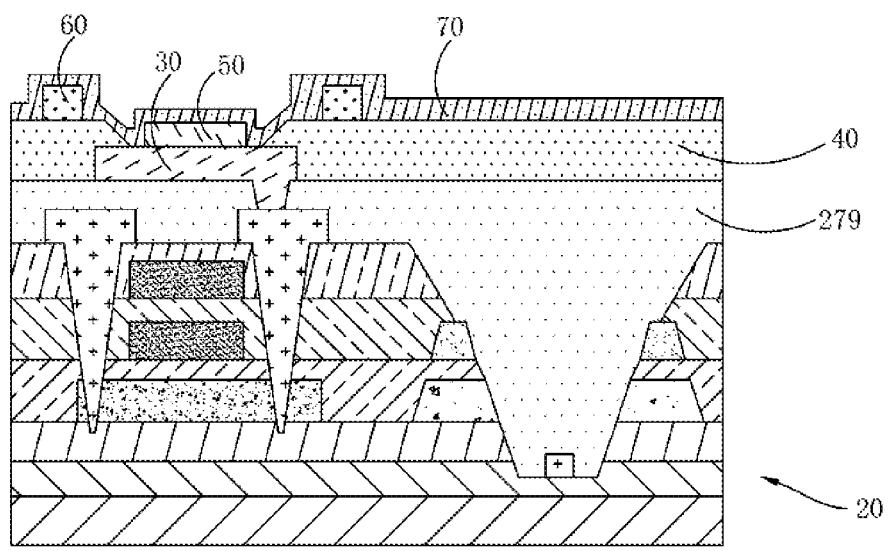
FIG. 18 is a diagram of an OLED display panel according to an embodiment of the present invention.

In addition, an OLED display panel is disclosed. As shown in FIG. 18, the OLED display panel comprises the array substrate 20 of any one of the above embodiments.

The OLED display panel further comprises an anode metal layer 30 and a pixel definition layer 40, positioned on the array substrate 20, a light emitting material layer 50, positioned on the anode metal layer 30; a supporting pillar 60, positioned on the pixel definition layer 40; and a cathode layer 70, positioned on the pixel definition layer 40, the supporting pillar 60, and the light emitting material layer 50.

The anode metal layer 30 and the pixel definition layer 40 are positioned on the planarization layer 279 of the array substrate 20.

According to an embodiment of the present invention, a blocking part 26 is positioned on the first film layer set 24. In the manufacturing process of the array substrate 20, after the second trench 251 is formed by an etching step, the blocking part 26 could be used as a mask to perform an etching step on the first film layer set 24. Furthermore, because the blocking effect of the blocking part 26, the etchant could flow to the first film layer set 24 only through the etching opening 261 such that the first trench 241, the second trench 251, and the via 291 connecting the source/drain 278 to the active layer 272 could be formed by etching the first film layer set 24 by one process. In this way, the number of masks and the processes could be reduced without affecting the performance of the array substrate 20 such that the manufacturing process is simplified and the cost is reduced.

Above are embodiments of the present invention, which does not limit the scope of the present invention. Any modifications, equivalent replacements or improvements within the spirit and principles of the embodiment described above should be covered by the protected scope of the invention.

The present disclosure is described in detail in accordance with the above contents with the specific preferred examples. However, this present disclosure is not limited to the specific examples. For the ordinary technical personnel of the technical field of the present disclosure, on the premise of keeping the conception of the present disclosure, the technical personnel can also make simple deductions or replacements, and all of which should be considered to belong to the protection scope of the present disclosure.

What is claimed is:

1. An array substrate, comprising:
a display area;
a bending area at a side of the display area;
a base substrate;
a first film layer set, positioned on the base substrate and comprising a buffer layer;
an active layer, positioned on the buffer layer;
a first gate insulating layer, covering the active layer;
a first gate electrode, positioned on the first gate insulating layer;
a second gate insulating layer, covering the first gate electrode;
a second gate electrode, positioned on the second gate insulating layer;
an interlayer dielectric layer, covering the second gate electrode;
a source/drain electrode, positioned on the interlayer dielectric layer; and
a planarization layer, covering the source/drain electrode; and
a second film layer set, positioned at one side of the first film layer set, which is comparatively far away from the base substrate, wherein the bending area has a first trench throughout the first film layer set and a second trench throughout the second film layer set; one side of the first film layer set close to the second film layer set has a blocking part; the blocking part has an etching opening corresponding to the first trench; the etching opening is throughout the blocking part; a bottom of the etching opening connects to a top of the first trench; a bottom of the second trench connects to a top of the blocking part; and an orthographic projection of the second trench on the base substrate covers an orthographic projection of the etching opening on the base substrate,
wherein the blocking part comprises:
a plurality of blocking blocks, positioned at a same layer as at least one of the active layer, the first gate electrode and the second gate electrode;
wherein the etching opening is throughout all the blocking blocks, and the blocking blocks extend along a first direction parallel to a length direction of the first trench,
wherein one end of the blocking blocks comparatively far away from the etching opening has a plurality of notches along a second direction, and the notches are distributed along the first direction.

2. The array substrate of claim 1, wherein the blocking blocks and the active layer are manufactured in a same process if the blocking blocks and the active layer are in a same layer; the blocking blocks and the first gate electrode are manufactured in a same process if the blocking blocks and the first gate electrode are in a same layer; and the blocking blocks and the second gate electrode are manufactured in a same process if the blocking blocks and the second gate electrode are in a same layer.

3. The array substrate of claim 1, wherein the blocking blocks comprises a plurality of blocking stripes distributed and equally-spaced along the first direction.

4. The array substrate of claim 1, wherein the blocking part comprises a first blocking block and a second blocking block, the first blocking block is positioned in a same layer as at least one of the active layer, the first gate electrode, and the second gate electrode, and the second blocking block is positioned in a same layer as at least another one of the active layer, the first gate electrode, and the second gate electrode;
wherein the first blocking block comprises a plurality of first blocking stripes distributed and equally-spaced along the first direction, two adjacent first blocking stripes has a first gap in between; the second blocking block comprises a plurality of second blocking stripes distributed and equally-spaced along the first direction, two adjacent second blocking stripes has a second gap in between; an orthogonal projection of a first blocking strip on the base substrate cover an orthogonal projection of the second gap on the base substrate; and an orthogonal projection of a second blocking strip on the base substrate covers an orthogonal projection of the first gap on the base substrate.

5. The array substrate of claim 1, wherein the first trench and the second trench are manufactured by a same process.

6. The array substrate of claim 1, wherein the interlayer dielectric layer has a via throughout the interlayer dielectric layer and extending to the active layer; the source/drain electrode is filling up in the via and electrically connected to the active layer; and the via, the first trench and the second trench are manufactured through a same process.

7. An organic light emitting diode (OLED) display panel, comprising:
   an array substrate, having a display area and a bending area at a side of the display area, the array substrate comprising:
   a base substrate;
   a first film layer set, positioned on the base substrate and comprising a buffer layer;
   an active layer, positioned on the buffer layer;
   a first gate insulating layer, covering the active layer;
   a first gate electrode, positioned on the first gate insulating layer;
   a second gate insulating layer, covering the first gate electrode;
   a second gate electrode, positioned on the second gate insulating layer;
   an interlayer dielectric layer, covering the second gate electrode;
   a source/drain electrode, positioned on the interlayer dielectric layer; and
   a planarization layer, covering the source/drain electrode; and
   a second film layer set, positioned at one side of the first film layer set, which is comparatively far away from the base substrate, wherein the bending area has a first trench throughout the first film layer set and a second trench throughout the second film layer set; one side of the first film layer set close to the second film layer set has a blocking part; the blocking part has an etching opening corresponding to the first trench; the etching opening is throughout the blocking part; a bottom of the etching opening connects to a top of the first trench; a bottom of the second trench connects to a top of the blocking part; and an orthographic projection of the second trench on the base substrate covers an orthographic projection of the etching opening on the base substrate,
   an anode metal layer and a pixel definition layer, positioned on the array substrate;
   a light emitting material layer, positioned on the anode metal layer;
   a supporting pillar, positioned on the pixel definition layer; and
   a cathode layer, positioned on the pixel definition layer, the supporting pillar, and the light emitting material layer,
   wherein the blocking part comprises:
   a plurality of blocking blocks, positioned at a same layer as at least one of the active layer, the first gate electrode and the second gate electrode;
   wherein the etching opening is throughout all the blocking blocks, and the blocking blocks extend along a first direction parallel to a length direction of the first trench,
   wherein one end of the blocking blocks comparatively far away from the etching opening has a plurality of notches along a second direction, and the notches are distributed along the first direction.

8. The OLED display panel of claim 7, wherein the blocking blocks and the active layer are manufactured in a same process if the blocking blocks and the active layer are in a same layer; the blocking blocks and the first gate electrode are manufactured in a same process if the blocking blocks and the first gate electrode are in a same layer; and the blocking blocks and the second gate electrode are manufactured in a same process if the blocking blocks and the second gate electrode are in a same layer.

9. The OLED display panel of claim 7, wherein the blocking blocks comprises a plurality of blocking stripes distributed and equally-spaced along the first direction.

10. The OLED display panel of claim 7, wherein the blocking part comprises a first blocking block and a second blocking block, the first blocking block is positioned in a same layer as at least one of the active layer, the first gate electrode, and the second gate electrode, and the second blocking block is positioned in a same layer as at least another one of the active layer, the first gate electrode, and the second gate electrode;
   wherein the first blocking block comprises a plurality of first blocking stripes distributed and equally-spaced along the first direction, two adjacent first blocking stripes has a first gap in between; the second blocking block comprises a plurality of second blocking stripes distributed and equally-spaced along the first direction, two adjacent second blocking stripes has a second gap in between; an orthogonal projection of a first blocking strip on the base substrate cover an orthogonal projection of the second gap on the base substrate; and an orthogonal projection of a second blocking strip on the base substrate covers an orthogonal projection of the first gap on the base substrate.

11. The OLED display panel of claim 7, wherein the first trench and the second trench are manufactured by a same process.

12. The OLED display panel of claim 7, wherein the interlayer dielectric layer has a via throughout the interlayer dielectric layer and extending to the active layer; the source/drain electrode is filling up in the via and electrically connected to the active layer; and the via, the first trench and the second trench are manufactured through a same process.

13. The OLED display panel of claim 7, wherein the first trench extends along its length direction to pass through a front side and a back side of the first film layer set; and the second trench extends along its length direction to pass through a front side and a back side of the second film layer set.

14. The OLED display panel of claim 7, wherein the first trench and the second trench are connected to each other, and an orthogonal projection of a second trench on the base substrate covers an orthogonal projection of the first trench on the base substrate.

* * * * *